(12) United States Patent
Minamio et al.

(10) Patent No.: US 7,242,538 B2
(45) Date of Patent: Jul. 10, 2007

(54) OPTICAL DEVICE

(75) Inventors: Masanori Minamio, Osaka (JP); Hikaru Sano, Hyogo (JP); Kenji Furumoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/962,594

(22) Filed: Oct. 13, 2004

(65) Prior Publication Data

US 2005/0168845 A1    Aug. 4, 2005

(30) Foreign Application Priority Data

Feb. 2, 2004    (JP)    ............... 2004-025063

(51) Int. Cl.
*G02B 7/02* (2006.01)

(52) U.S. Cl. .................. 359/819; 359/811; 257/680

(58) Field of Classification Search ........... 359/808, 359/811, 819; 257/680
See application file for complete search history.

(56) References Cited

U.S. PATENT DOCUMENTS 5,040,868 A * 8/1991 Waitl et al. ............ 385/33
5,296,724 A * 3/1994 Ogata et al. ............ 257/98
6,459,130 B1 * 10/2002 Arndt et al. ............ 257/432
6,610,563 B1 * 8/2003 Waitl et al. ............ 438/166
6,735,023 B2 * 5/2004 Schunk .................. 359/808

FOREIGN PATENT DOCUMENTS

| JP | 2000-58805 | 2/2000 |
| JP | 2002-43553 | 2/2002 |
| JP | 2002-43554 | 2/2002 |
| JP | 2003-174574 | 6/2003 |

* cited by examiner

*Primary Examiner*—Hung Dang
*Assistant Examiner*—Joseph Martinez
(74) *Attorney, Agent, or Firm*—McDermott Will & Emery LLP

(57) ABSTRACT

An optical device includes a base of ring shape, and a light emitting/receiving element and a transparent plate both attached to the base. A side face of the opening of the base is formed to have a taper serving as a draft for a molding resin. A side surface of the transparent plate is formed to have a taper widened upwardly and corresponding to the draft. These side face and surface engage each other with an adhesive layer interposed therebetween. A hologram may be mounted instead of the transparent plate.

20 Claims, 6 Drawing Sheets

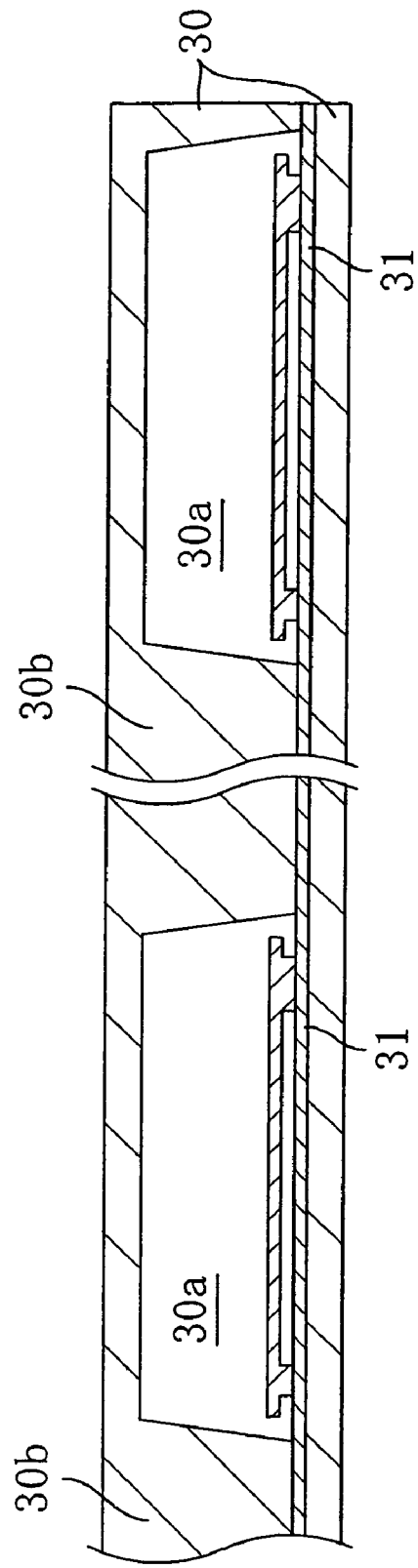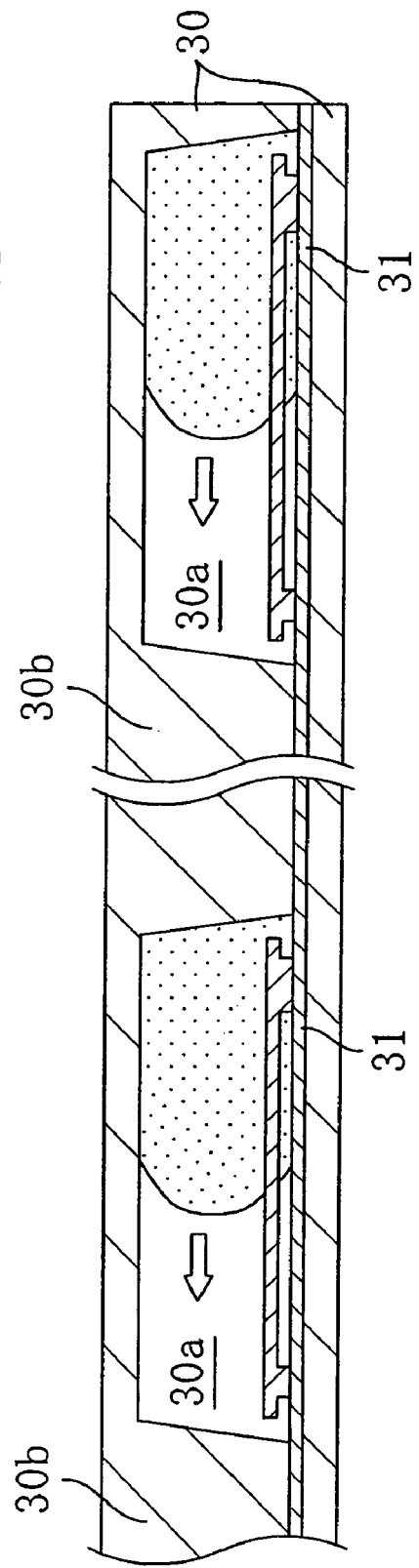
FIG. 3A
FIG. 3B

OPTICAL DEVICE

CROSS REFERENCE TO RELATED APPLICATIONS

This application claims priority under 35 U.S.C. § 119 on Patent Application No. 2004-025063 filed in Japan on Feb. 2, 2004, the entire contents of which are hereby incorporated by reference.

BACKGROUND OF THE INVENTION (a) Fields of the Invention

The present invention relates to optical devices which have light emitting/receiving elements mounted thereon and which are used for cameras such as camcorders, digital cameras, or digital still cameras and optical pickup systems for CDs, DVDs, or MDs, and to methods for fabricating such a device.

(b) Description of Related Art

In recent years, optical devices have been incorporated in cameras such as camcorders, digital cameras, or digital still cameras and optical pickup systems for CDs, DVDs, or MDs. The optical devices are each provided in a package form produced in the following manner. A light emitting/receiving element is mounted on a base of an insulating material and then packaging is made so that a transparent plate covers a light emitting/receiving area of the mounted element.

FIG. 6 is a sectional view showing the structure of a solid-state image sensing device which is a type of conventional optical device (see Document 1 (Japanese Unexamined Patent Publication No. 2002-43554)). Referring to FIG. 6, the solid-state image sensing device includes, as main components, a base 131, a solid-state image sensing element 135, a transparent plate 136, and an adhesive layer 140. The base 131 of frame shape is made of thermosetting resin and has an opening 132 in its center portion. The solid-state image sensing element 135 is formed of, for example, a CCD and attached to the lower surface of the base 131. The transparent plate 136 is made of glass and attached to the upper surface of the base 131 so that the plate faces the solid-state image sensing element 135 with the opening 132 interposed therebetween. The adhesive layer 140 mechanically connects the transparent plate 136 to the base 131.

The lower surface of the base 131 is provided with wires 134 which are made of a gold plated layer and are embedded in the resin. The solid-state image sensing element 135 is attached to the lower surface of the base 131 and disposed so that a light receiving area 135a thereof is exposed in the opening 132.

The solid-state image sensing element 135 is provided with electrode pads (not shown) for sending and receiving signals between the solid-state image sensing element 135 and external equipment. At an end of each wire 134 adjacent to the opening 132, an internal terminal portion is exposed from the resin. The internal terminal portion of each wire 134 and the corresponding electrode pad of the solid-state image sensing element are electrically connected to each other with a bump (protruding electrode) 138 interposed therebetween. In addition, a solder ball 141 is annexed onto an external terminal portion of each wire 134. On the lower surface of the base 131, the solid-state image sensing element 135, the wires 134, and the bumps 138 are hermetically sealed with a sealing resin 137 provided around the solid-state image sensing element 135.

The solid-state image sensing device thus constructed is mounted on a circuit board so that the transparent plate 136 is directed upward as shown in FIG. 6. A lens barrel with an optical imaging system incorporated therein is fixed onto the base 131 as shown by the broken lines in FIG. 6. The positional relation between the lens barrel and the base 131 has a defined accuracy required to fall within a predetermined error.

As mentioned above, the light receiving area 135a of the solid-state image sensing element 135 is disposed in the opening 132 when viewed from above. Through the optical imaging system incorporated in the lens barrel, light from an imaged object is condensed on the light receiving area 135a of the solid-state image sensing element 135. The condensed light is converted into electricity by the solid-state image sensing element 135.

Also, another example of the solid-state image sensing device has been known which uses a base having, unlike the base 131 shown in FIG. 6, a recess formed in its surface on which a solid-state image sensing element is mounted thereon (for example, see Document 2 (Japanese Unexamined Patent Publication No. 2000-58805)).

Note that if a light receiving element and a light emitting element are disposed in the optical device, the light emitting element with a relatively small dimension is generally mounted above the light receiving element.

In recent years, optical devices with light receiving and light emitting elements disposed therein have also been put into practical use. In such devices, instead of the transparent plate 136, a hologram is attached onto the base 131 (to form a hologram unit).

SUMMARY OF THE INVENTION

The structure of the conventional solid-state image sensing device shown in FIG. 6, however, has a severe restriction on the dimension H shown in FIG. 6. This restriction causes the following disadvantage.

Specifically, the allowable range of the dimension H shown in FIG. 6 is fixed at a given upper limit (for example, about 350 μm) or lower. On the other hands, in order to secure the strength of the transparent plate 136 (glass plate), the plate has to have a certain amount of thickness. Moreover, in consideration of variations in thickness between fabricated plates, the allowable limit of the distance B between the upper surfaces of the transparent plate 136 and the base 131 will be extremely low. However, there is a limitation to compatibility between the thinness of the glass plate and the attainment of reliability of the device.

The device in which, instead of the transparent plate 136, a hologram is mounted on the base 131 also has the same disadvantage.

An object of the present invention is to provide a downsized optical device with high reliability by taking measures to reduce the total vertical size of the device as well as to keep the thickness of a base and the vertical size of a transparent member sufficiently great.

An optical device of the present invention is made by engaging a side face of an opening of a base with a side surface of a transparent member with an adhesive layer interposed therebetween. The side face of the opening of the base is formed to have a taper corresponding to a draft for a molding resin, and the side surface of the transparent member has the same taper as the side face of the opening of the base.

With this device, even if the transparent plate and the base are sufficiently thickened, the draft for a molding resin can be utilized to reduce the distance B shown in FIG. 6, that is, the distance between the upper surfaces of the transparent plate and the light emitting/receiving element or the difference in vertical position between the upper surfaces of the transparent plate and the base. Moreover, the draft for a molding resin is utilized to eliminate the necessity to provide additional process steps such as the step of thinning the surrounding of the opening of the base. This prevents possible obstruction of the flow of the molding resin in a molding process and possible degradation of the strength of the base. Therefore, a downsized optical device with high reliability can be provided.

The taper angle of the side face of the opening of the base is preferably within 1 to 20°, and more preferably within 3 to 12°.

As the optical device, modified embodiments can be employed. An exemplary modified embodiment is that the upper area of the side face of the opening of the base is formed to have an additional taper which has a greater taper angle than the taper corresponding to the draft, or that the side face of the opening of the base is formed to have a step.

If the transparent member is a glass window, the difference in vertical position between the upper surfaces of the transparent member and the base is preferably 300 µm or smaller, and more preferably 100 µm or smaller for the purpose of downsizing the device.

The transparent member may be a hologram or a glass window.

A method for fabricating an optical device according to the present invention is conducted in the following manner. A lead frame is placed in a die cavity which is surrounded with a side wall formed to have a draft for a molding resin, and then a molding process is performed to form a molded structure having a plurality of optical device formation regions. Each of the regions surrounds an opening with a side face formed to have a taper corresponding to the draft. Thereafter, a transparent member formed to have a taper corresponding to the draft is engaged with the side face of the opening.

With this method, the necessity to provide additional process steps such as the step of thinning the surrounding of the opening of the base is eliminated. This prevents possible obstruction of the flow of the molding resin in the molding process and possible degradation of the strength of the base. Therefore, a downsized optical device with high reliability can be provided while a rise in manufacturing costs is prevented.

Preferably, prior to the molding process, the lead frame serving as wires is attached to a molding die with the lead frame put on a sealing tape.

With the optical device of the present invention, the transparent member which has the side surface formed to have a taper corresponding to the draft of the side face of the opening of the base can be used to provide a downsized optical device with high reliability.

BRIEF DESCRIPTION OF THE DRAWINGS

FIGS. 3A and 3B are sectional views showing molding steps of the fabrication steps of the optical device according to the first embodiment.

DETAILED DESCRIPTION OF THE PREFERRED EMBODIMENTS

First Embodiment

Figure 1:
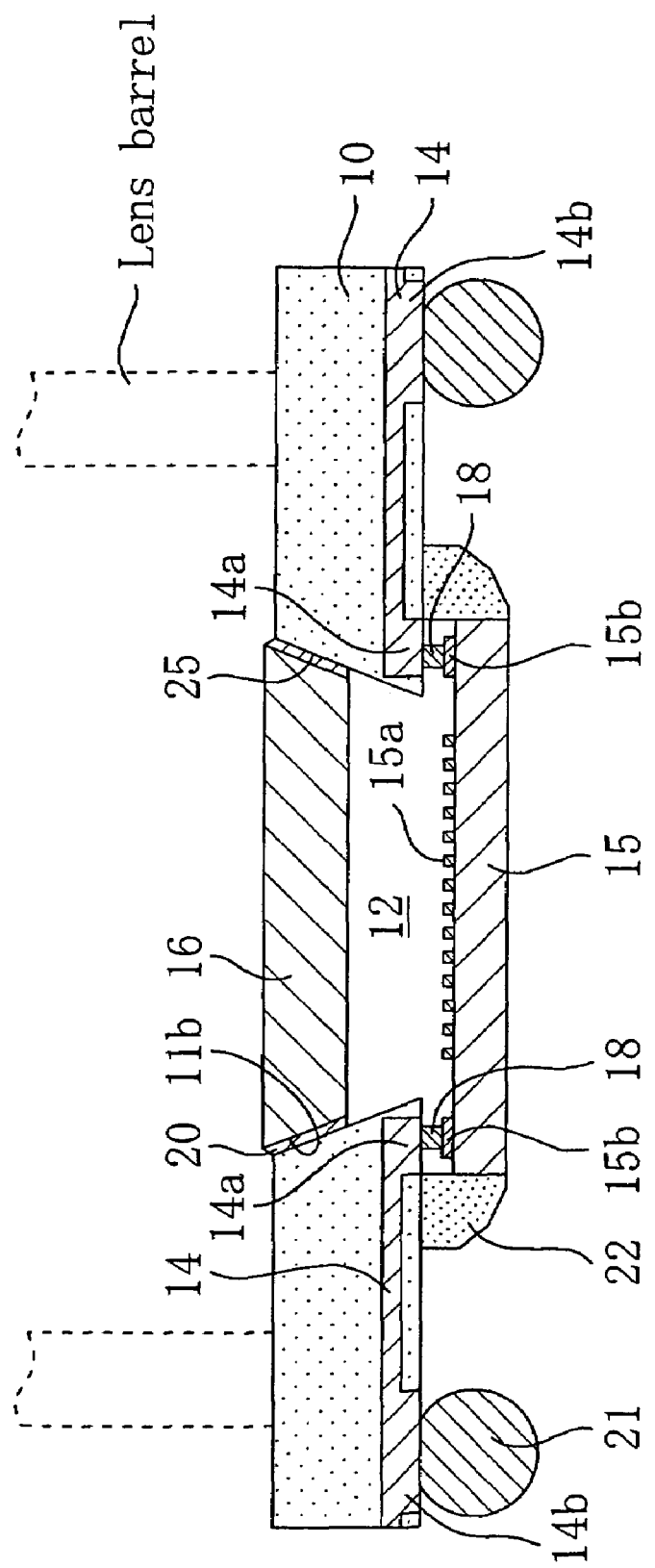
FIG. 1 is a sectional view showing the structure of an optical device according to a first embodiment.

FIG. 1 is a sectional view of an optical device according to a first embodiment. The optical device of this embodiment includes, as main components, a base 10, a light emitting/receiving element 15, a transparent plate 16, and an adhesive layer 20. The base 10 of frame shape is made of thermosetting resin such as epoxy resin and has an opening 12 in its center portion. The light emitting/receiving element 15 is attached to the lower surface side of the base 10. The transparent plate 16 is made of glass and attached to engage a side face of the opening 12 of the base 10. The adhesive layer 20 mechanically connects the transparent plate 16 to the base 10. The light emitting/receiving element 15 of the first embodiment indicates only a light receiving element such as a CCD (charge-coupled device) solid-state image sensing element. However, the light emitting/receiving element 15 may be an element including a CCD solid-state image sensing element and a semiconductor laser (light emitting element) mounted thereon. In this case, if the optical device of the first embodiment is incorporated in an optical pickup or the like, the transparent plate 16 is removed and a hologram as shown in a second embodiment is then attached to the base 10 (to form a hologram unit). In the case of attaching the hologram, generally, no lens barrel can be ultimately attached to the device.

The lower surface of the base 10 is provided with a wire 14 which is made of a gold plated layer and which is embedded in a resin. The light emitting/receiving element 15 is attached to the lower surface of the base 10 and disposed so that a light emitting/receiving area 15a thereof is exposed in the opening 12.

The light emitting/receiving element 15 is provided with an electrode pad 15b for sending and receiving signals between the light emitting/receiving element 15 and external equipment. An internal terminal portion 14a is formed in an edge of the wire 14 adjacent to the opening 12, and thus the internal terminal portion 14a of the wire 14 and the electrode pad 15b are electrically connected to each other with a bump (protruding electrode) 18 interposed therebetween. In addition, a solder ball 21 is annexed onto an external terminal portion 14b of the wire 14. On the lower surface side of the base 10, the light emitting/receiving element 15, the wire 14, and the bump 18 are hermetically sealed with a sealing resin 22 provided around the light emitting/receiving element 15.

The optical device thus constructed is mounted on a circuit board so that the transparent plate 16 is directed upward as shown in FIG. 1. A lens barrel with an optical imaging system incorporated therein is installed onto the base 10 as shown by the broken lines in FIG. 1. The positional relation between the lens barrel and the base 10 has a defined accuracy required to fall within a predetermined error.

A light emitting/receiving area 15a of the light emitting/receiving element 15 is disposed within the opening 12 when viewed from above. Through the optical system incorporated in the lens barrel, light from an imaged object is condensed on the light emitting/receiving area of the light emitting/receiving element 15.

As shown in FIG. 1, in the first embodiment, a side face 25 of the opening 12 of the base 10 is formed to have a taper serving as a draft for a molding resin. The opening with the taper is upwardly widened. A side surface 26 of the transparent plate 16 is also formed to have a taper substantially coincident with the draft widened upwardly, and the side face 25 and the side surface 26 engage each other. The wording "substantially coincident with" means that the taper is designed to coincide with the draft if variations occurring during fabrication of members of the device or by temperatures used are ignored. The adhesive layer 20 is formed to fill a gap between the side face 25 of the opening 12 of the base 10 and the side surface 26 of the transparent plate 16 both of which engage each other.

In the first embodiment, the upper surface of the transparent plate 16 is located above the upper surface of the base 10. Alternatively, these upper surfaces may be located substantially in the same plane, or the upper surface of the transparent plate 16 may be located below the upper surface of the base 10. If the specification of thickness of the glass plate used for this optical device is set at t±c (μm), the difference in vertical position between the upper surfaces of the transparent plate 16 and the base 10 can be set at t−c (μm) in the first embodiment. Specifically, for example, if the thickness of the transparent plate 16 is 350±50 (μm) (which is a typical specification of the transparent plate in the optical pickup field), the difference in vertical position between the upper surfaces of the transparent plate 16 and the base 10 is preferably 300 μm or smaller. Further, in consideration of the positional stability of each of the side surface 26 of the transparent plate 16, the side face 25 of the opening 12 of the base 10, and the light emitting/receiving element, the difference in vertical position between the upper surfaces of the transparent plate 16 and the base 10 is more preferably 100 μm or smaller.

Figure 6:
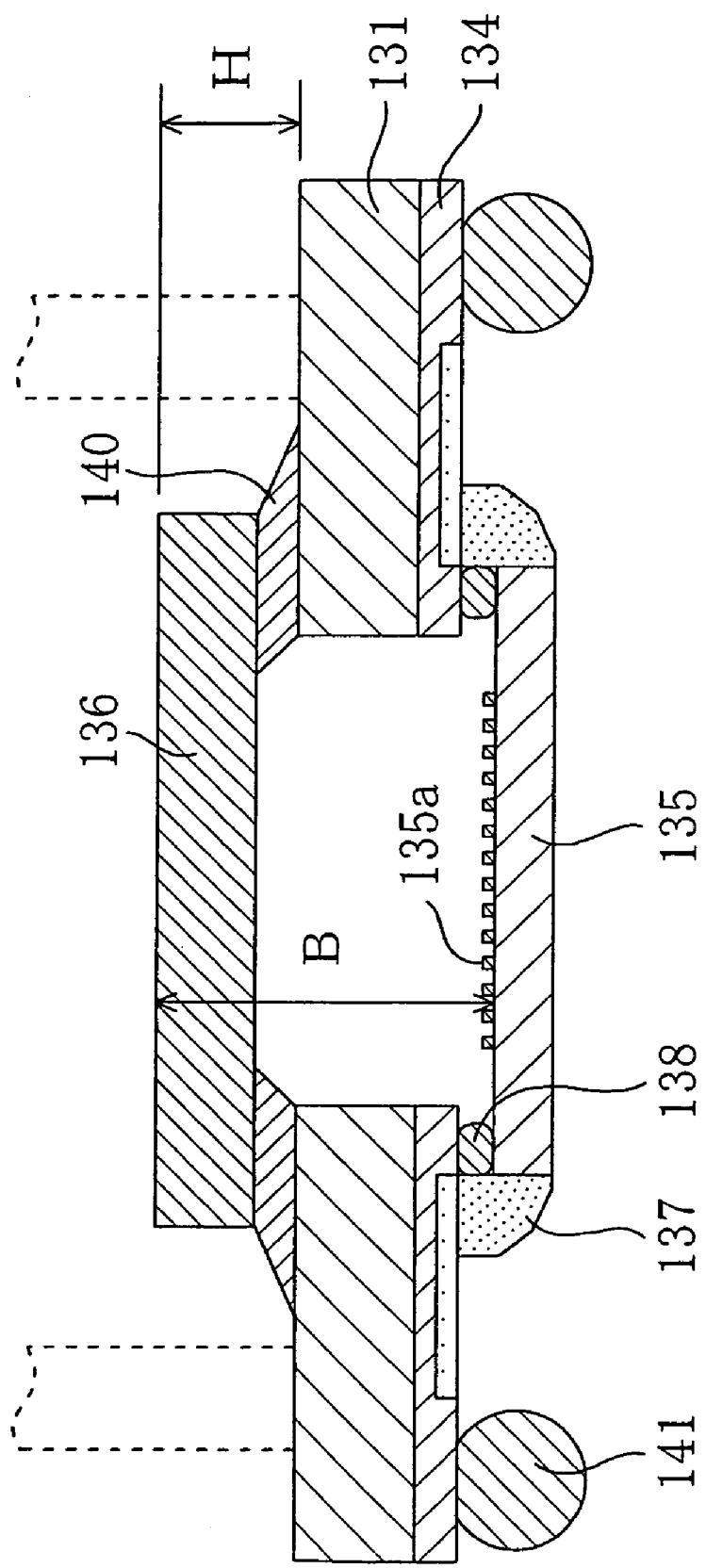
FIG. 6 is a sectional view showing the structure of a conventional optical device.

In the first embodiment, the draft for a molding resin formed on the side face 25 of the opening 12 of the base 10 is utilized to engage at least part of the side surface 26 of the transparent plate 16 with the side face 25 of the opening 12 of the base 10. This reduces the distance B shown in FIG. 6, that is, the distance between the upper surfaces of the transparent plate 16 and the light emitting/receiving element 15 or the difference in vertical position between the upper surfaces of the transparent plate 16 and the base 10 even if the transparent plate 16 and the base 10 are sufficiently thickened. Moreover, the draft for a molding resin is utilized to eliminate the necessity to provide additional steps such as the step of thinning the surrounding of the opening 12 of the base 10. This prevents possible obstruction of the flow of the molding resin in a molding process and possible degradation of the strength of the base. Therefore, a downsized optical device with high reliability can be provided while a rise in manufacturing costs is prevented.

Fabrication Step of Optical Device

FIGS. 2A to 2F are sectional views showing fabrication steps of the optical device according to the first embodiment. Note that in the steps shown in FIGS. 2A to 2C, only two optical device formation regions are illustrated. However, in general, in the steps shown in FIGS. 2A to 2C, the fabrication process is implemented using a lead frame which has a number of optical device formation regions arranged in grid pattern.

FIGS. 3A and 3B are sectional views showing molding steps of the fabrication steps of the optical device according to the first embodiment.

Figure 2A:
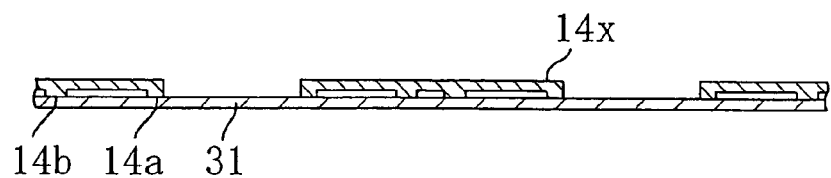
FIGS. 2A to 2F are sectional views showing fabrication steps of the optical device according to the first embodiment.

First, in the step shown in FIG. 2A, a lead frame 14x formed with a wiring pattern is put on a sealing tape 31. Recesses made by half-etching or pressing are provided in most of the lower portion of the lead frame 14x, and only portions to be formed into an external terminal portion 14b or an internal terminal portion 14a protrude downward from the bottom surface of the recess.

Figure 2B:
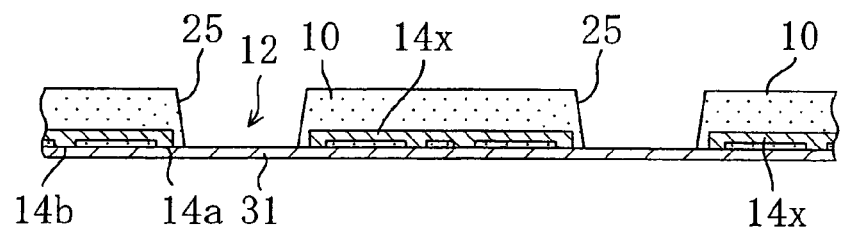

Subsequently, a molding process is conducted in the step shown in FIG. 2B. Specifically, as shown in FIGS. 3A and 3B, the lead frame 14x with the sealing tape 31 attached thereto is installed in a molding die 30. Die cavities 30a of the molding die 30 are filled with thermosetting resin (molding resin) such as epoxy resin, and all portions of the lead frame 14x but the internal terminal portion 14a and the external terminal portion 14b are embedded in the molding resin to form a molded structure. Since the molding resin does not fill partitions 30b for separating the die cavities 30a of the molding die 30 from each other, the center portions of the optical device formation regions in the molded structure are formed with openings 12 for installing the light emitting/receiving elements, respectively. A side wall of the die cavity 30a of the molding die 30 is formed to have a taper serving as a draft for the molding resin. That is to say, a side face of the opening 12 is formed to have a taper as the draft.

Figure 2C:
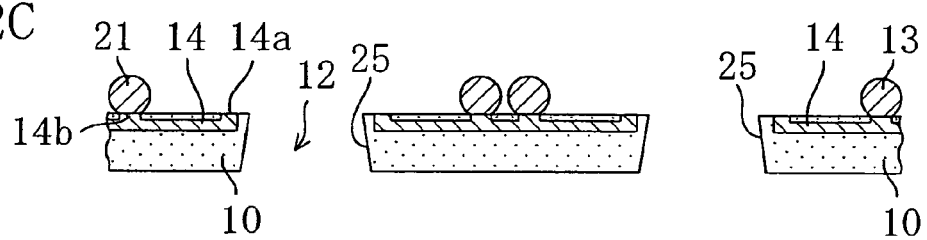

In the step shown in FIG. 2C, the sealing tape 31 is removed from the molded structure, and then the molded structure is placed so that the surface with the internal terminal portion 14a and the external terminal portion 14b exposed therefrom faces upward. Solder balls 21 are formed on the external terminal portions 14b, respectively.

Figure 2D:
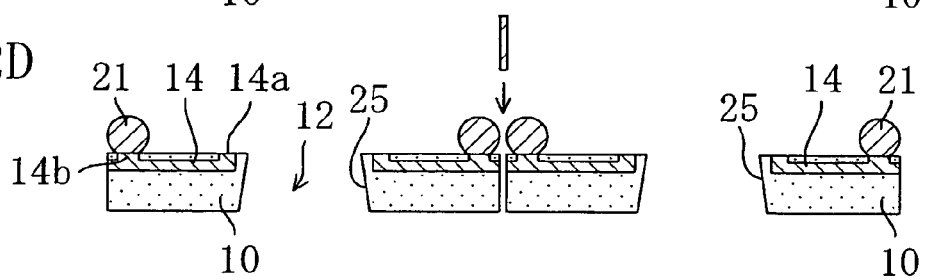

Next, in the step shown in FIG. 2D, the molded structure is split, with a blade, at the center of a dicing region located on the boundary between the adjacent optical device formation regions, thereby forming the bases 10 of the individual optical devices from the molded structure. At this time, the wire 14 having a number of internal and external terminal portions 14a and 14b is embedded in each of the bases 10.

Figure 2E:
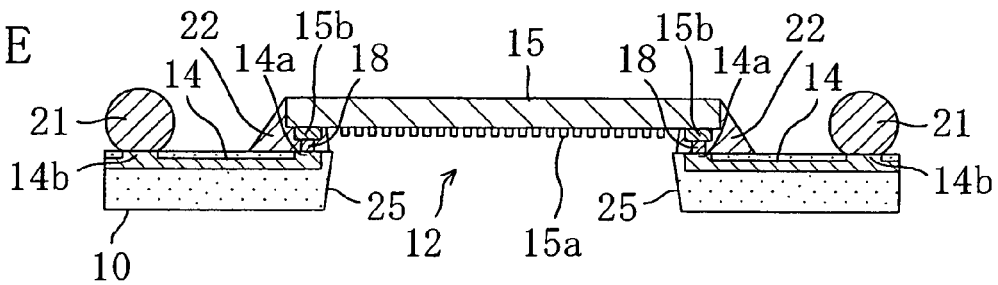

In the step shown in FIG. 2E, the light emitting/receiving element 15 is mounted on the base 10 so that the light emitting/receiving area 15a thereof faces downward. In this mount, the bumps 18 are provided on the internal terminal portions 14a on the base 10, respectively, and the electrode pads 15b of the light emitting/receiving element 15 are connected onto the bumps 18, respectively. A sealing resin 22 fills gaps present in the connection portion.

Figure 2F:
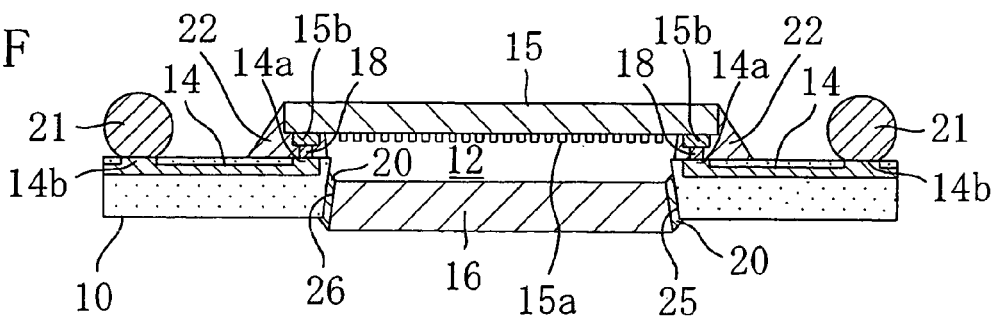

In the step shown in FIG. 2F, while the side of the base 10 with the light emitting/receiving element 15 mounted thereon (the lower surface) faces downward, the transparent plate 16 is engaged with the opening 12 of the base 10 with an adhesive interposed therebetween. The side surface 26 of the transparent plate 16 has been previously formed to have a taper corresponding to the draft on the side face 25 of the opening 12 of the base 10. A gap between the side surface 26 of the transparent plate 16 and the side face 25 of the opening 12 of the base 10 is filled with the adhesive layer 20 with a thickness of about 10 μm to hermetically seal the opening 12.

According to the fabrication method of the first embodiment, in the step shown in FIG. 2F, use is made of the transparent plate 16 which has the side surface 26 formed to have the same taper as the taper (see FIGS. 2B and 3B) formed on the side face 25 of the base 10 and corresponding to the draft for the molding resin, and thus the transparent plate 16 is engaged with the opening 12 of the base 10.

Therefore, the optical device with the structure shown in FIG. 1 can be formed easily. Moreover, since, in the molding process shown in FIGS. 2B and 3B, it is unnecessary to thin the portion of the base 10 around the opening, the flow of the molding resin is not obstructed and the strength of the base 10 is not degraded.

The split step shown in FIG. 2D can be carried out either after the attachment step of the light emitting/receiving element shown in FIG. 2E or after the attachment step of the window member shown in FIG. 2F.

In the fabrication steps of the first embodiment, the molding step is carried out in the state in which the lead frame is put on the sealing tape, but the sealing tape does not always have to be used. However, in the case of using the sealing tape, the upper and lower surfaces of the lead frame can be clamped with an upper die and a lower die to provide with stability the state in which the faces of the two dies tightly adhere to the upper and lower surfaces of the lead frame, respectively. As a result, the occurrence of a resin flash by the molding is efficiently suppressed and the structure in which the external terminal portion 14b protrudes from the sealing resin is obtained. Therefore, incorporation of the optical device can be made easily and swiftly. For example, soldering in incorporating the optical device in a mother board is readily conducted. Furthermore, in the case of using the sealing tape 31, the taper widened toward the light-coming side facing the light emitting/receiving area 15a of the light emitting/receiving element 15 is provided as the draft for the sealing die 30. Thus, the resin sealing process using the sealing tape 31 can be employed as the fabrication process of the structure shown in FIG. 1 to exert significant effects.

Second Embodiment

Figure 4:
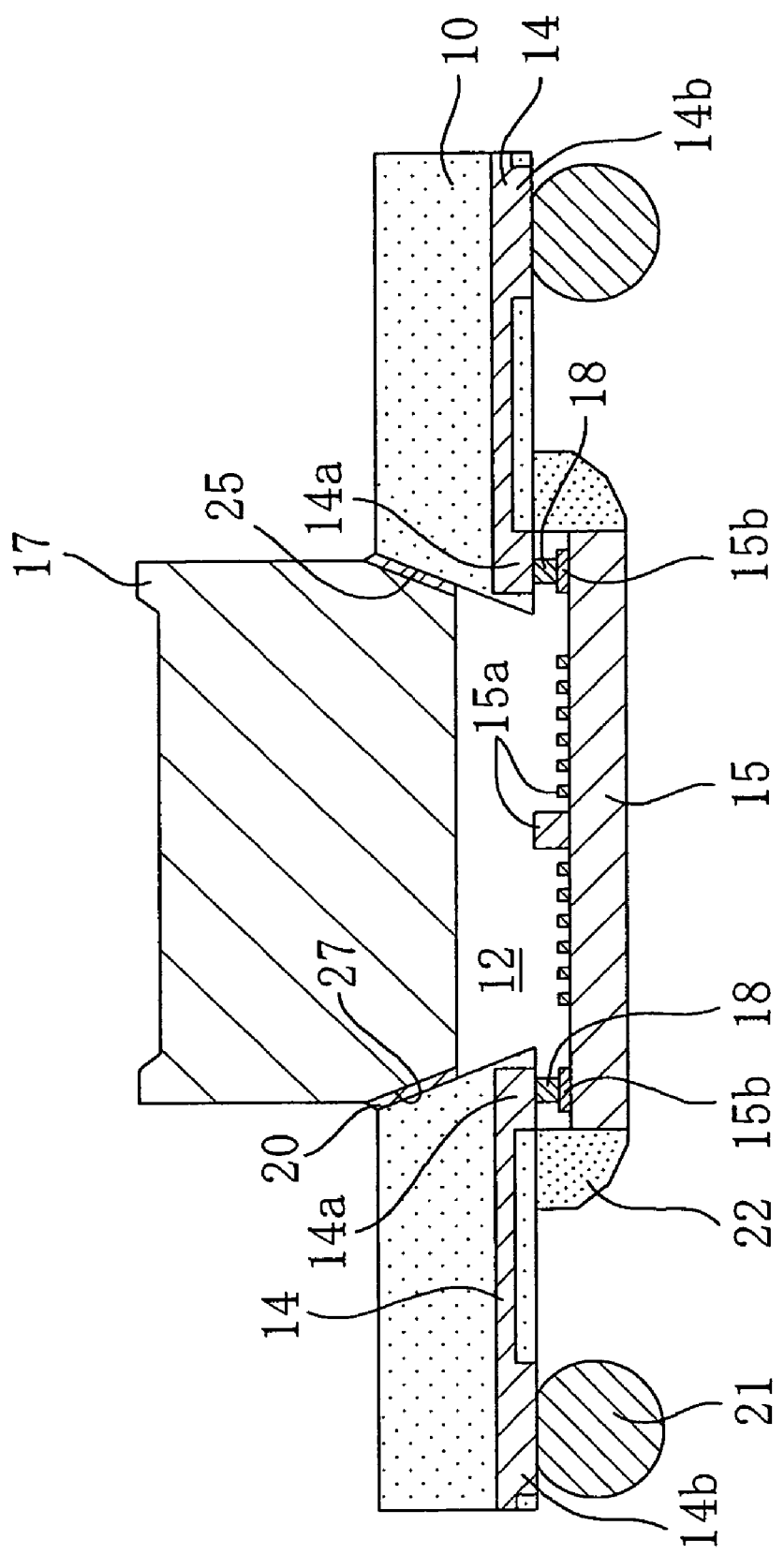
FIG. 4 is a sectional view of an optical device according to a second embodiment.

FIG. 4 is a sectional view of an optical device according to a second embodiment. The optical device of this embodiment includes, as main components, a base 10, a light emitting/receiving element 15, a hologram 17, and an adhesive layer 20. The base 10 of frame shape is made of thermosetting resin such as epoxy resin and has an opening 12 in its center portion. The light emitting/receiving element 15 is composed of a CCD attached to the lower surface side of the base 10 and a semiconductor laser attached onto the CCD. The hologram 17 is made of resin and attached to the upper surface side of the base 10 so that the hologram faces the light emitting/receiving element 15 with the opening 12 interposed therebetween. The adhesive layer 20 mechanically connects the hologram 17 to the base 10.

The lower surface of the base 10 is provided with a wire 14 which is made of a gold plated layer and which is embedded in a resin. The light emitting/receiving element 15 is attached to the lower surface of the base 10 and disposed so that the light emitting/receiving area 15a is exposed in the opening 12.

The light emitting/receiving element 15 is provided with an electrode pad 15b for sending and receiving signals between the light emitting/receiving element 15 and external equipment. An internal terminal portion 14a is formed in an edge of the wire 14 adjacent to the opening 12, and thus the internal terminal portion 14a of the wire 14 and the electrode pad 15b are electrically connected to each other with a bump (protruding electrode) 18 interposed therebetween. In addition, a solder ball 21 is annexed onto an external terminal portion 14b of the wire 14. On the lower surface side of the base 10, the light emitting/receiving element 15, the wire 14, and the bump 18 are hermetically sealed with a sealing resin 22 provided around the light emitting/receiving element 15.

The optical device thus constructed is mounted on a circuit board so that the hologram 17 is directed upward as shown in FIG. 4.

As described above, the light emitting/receiving area 15a of the light emitting/receiving element 15 is disposed within the opening 12 when viewed from above. In the optical device of the second embodiment, instead of the transparent plate 16, the hologram 17 is put above the base 10. The hologram 17 splits light having been reflected from a recording media and returned to the CCD, and transfers the split beams into multiple light receiving elements. In this embodiment, the material forming the hologram 17 is resin (plastic), but glass may alternatively be used thereas.

As shown in FIG. 4, in the second embodiment, a side face 25 of the opening 12 of the base 10 is formed to have a taper corresponding to a draft for a molding resin. The opening with the taper is widened upwardly. A lower side surface 27 of the hologram 17 is also formed to have a taper substantially coincident with the draft widened upwardly. The wording "substantially coincident with" means that the taper is designed to coincide with the draft if variations occurring during fabrication of members of the device or by temperatures used are ignored. The adhesive layer 20 is formed to fill a gap between the side face 25 of the opening 12 of the base 10 and the lower side surface 27 of the hologram 17 both of which engage each other.

In the second embodiment, the draft for a molding resin formed on the side face 25 of the opening 12 of the base 10 is utilized to engage at least part of the lower side surface 27 of the hologram 17 with the side face 25 of the opening 12 of the base 10. This reduces the distance B shown in FIG. 6, that is, the distance between the upper surfaces of the hologram 17 and the light emitting/receiving element 15 or the difference in vertical position between the upper surfaces of the hologram 17 and the base 10 even if the hologram 17 and the base 10 are sufficiently thickened. Therefore, a downsized optical device with high reliability can be provided.

In particular, the draft for a molding resin is utilized to eliminate the necessity to provide an additional step for forming a taper on the side face of the opening 12 of the base 10. This prevents a rise in manufacturing costs.

Modification of First and Second Embodiment

Figure 5A:
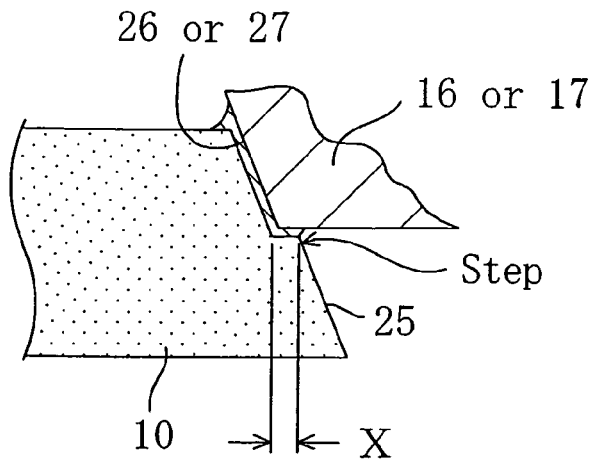
FIGS. 5A, 5B, and 5C are sectional views showing parts of optical devices according to first, second, and third modifications of the first and second embodiments, respectively.
Figure 5B:
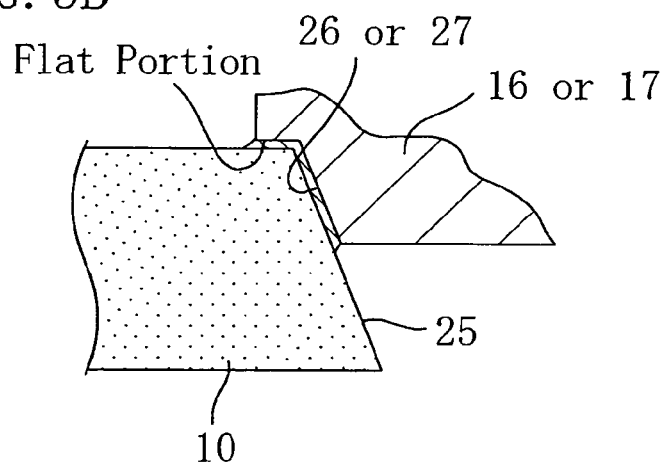
Figure 5C:
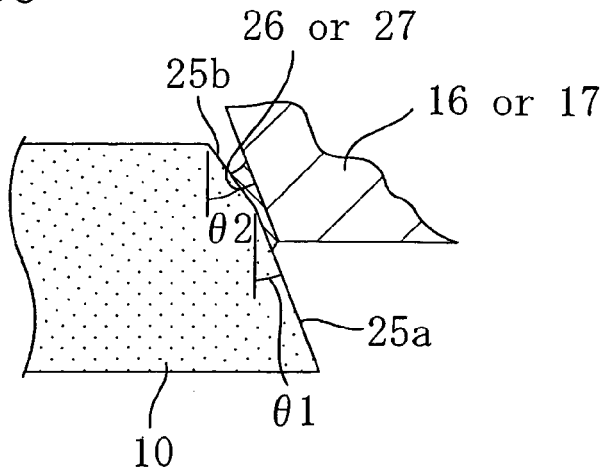

FIGS. 5A, 5B, and 5C are sectional views showing parts of optical devices according to first, second, and third modifications of the first and second embodiments, respectively.

In the first modification shown in FIG. 5A, the side face 25 of the opening of the base 10 is formed to have a stepped taper. At least part of the side surface 26 of the transparent plate 16 or the lower side surface 27 of the hologram 17 engages only the upper portion (a portion) of the side face 25 of the opening of the base 10, and the lower surface of the transparent plate 16 or the hologram 17 is put above the step of the side face 25 of the opening of the base 10 with the adhesive layer 20 interposed therebetween. In this case, the side wall of the die cavity 30a of the sealing die 30 shown in FIGS. 3A and 3B is also formed to have a similar stepped taper as a draft.

In the first modification, since the side face 25 of the opening of the base 10 is formed to have the stepped taper, the position the lower surface of the transparent plate 16 or the hologram 17 reaches is settled. This certainly prevents the possibility that the lower surface of the transparent plate 16 or the hologram 17 comes into contact with the light emitting/receiving element 15 and further minimizes variations in vertical size of the optical device which occur during fabrication thereof. The horizontal size of the step of the stepped taper of the side face is preferably within 100 to 300 μm. As long as the size is within such a range, the transparent plate 16 or the hologram 17 can be put with stability above the step of the side face 25 of the opening 12 of the base 10, and simultaneously obstruction of the flow of the molding resin and degradation of the strength of the base 10 can be prevented in the molding process shown in FIGS. 2B and 3B.

In the second modification shown in FIG. 5B, the side surface 26 of the transparent plate 16 or the lower side surface 27 of the hologram 17 is formed to have a flat portion. Only part of the side surface 26 of the transparent plate 16 or the lower side surface 27 of the hologram 17 engages the side face 25 of the opening of the base 10, and the flat potion of the side surface 26 of the transparent plate 16 or the lower side surface 27 of the hologram 17 is put above the upper surface of the base 10 with the adhesive layer 20 interposed therebetween.

In the second modification, since the side surface 26 of the transparent plate 16 or the lower side surface 27 of the hologram 17 is formed to have the flat portion, the position the lower surface of the transparent plate 16 or the hologram 17 reaches is settled. This certainly prevents the possibility that the lower surface of the transparent plate 16 or the hologram 17 comes into contact with the light emitting/receiving element 15 and further minimizes variations in vertical size of the optical device which occur during fabrication thereof.

In the third modification shown in FIG. 5C, the opening of the base 10 is formed to have a lower side face 25a and an upper side face 25b which have different taper angles. At least part of the side surface 26 of the transparent plate 16 or the lower side surface 27 of the hologram 17 engages the lower side face 25a of the opening of the base 10, and a gap present in the engagement portion is filled with the adhesive layer 20. In this case, the side wall of the die cavity 30a of the sealing die 30 shown in FIGS. 3A and 3B also has the shape corresponding to the lower and upper side faces 25a and 25b.

In the third modification, since the opening of the base 10 is formed to have the lower and upper side faces 25a and 25b which have different taper angles, the upper edge of the adhesive layer 20 can be thickened. This secures the strength of mechanical connection between the base and the transparent plate 16 or the hologram 17.

In the embodiments and modifications described above, the taper angle θ1 corresponding to the draft for a molding resin shown in FIG. 5C is preferably within 1 to 20°, and more preferably within 3 to 12°.

In the third modification of the first and second embodiments, the taper angle θ2 of the upper side face 25b is preferably greater than θ1 and equal to or less than 60°.

In the structures shown in FIGS. 1, 2, and 4 relating to the embodiments described above, only the radially outer sides of the bump 18 and the pad electrode 15b are filled with the sealing resin 22. However, as long as the sealing resin 22 does not overlap with the pixel-arranging surface of the light receiving element, the sealing resin 22 can also be provided on both the radially inner and outer sides of the bump 18 and the pad electrode 15b for the purpose of improving the adhesion.

The optical device according to the present invention can be utilized as an image sensor, a hologram unit, and the like which are produced by mounting a light emitting/receiving element and which are used for a camera such as a camcorder, a digital camera, or a digital still camera and an optical pickup system for CD, DVD, or MD.

What is claimed is:

1. An optical device comprising:
    a base provided with an opening which is a hole through the base and whose side face has a taper widened toward a front side face of the base;
    a wire embedded in the base so that an internal terminal portion and an external terminal portion are exposed from a back side face of the base and are in the same plane;
    a transparent member covering the opening from the front side face of the base; and
    a light emitting/receiving element coupled to the internal terminal portion of the wire with a bump so that the light emitting/receiving element covers the opening from the back side face of the base,
    wherein a side surface of the transparent member has a taper widening in an upward direction so that at least a part of the side surface of the member engages the side face of the opening of the base, and
    the opening is located between the light emitting/receiving element and the transparent member.

2. The device of claim 1, wherein the taper angle of the side face of the opening of the base is within 1 to 20°.

3. The device of claim 1, wherein the taper angle of the side face of the opening of the base is within 3 to 12°.

4. The device of claim 1, wherein the upper area of the side face of the opening of the base is formed to have an additional taper which has a greater taper angle than the taper of the lower area.

5. The device of claim 1, wherein the side face of the opening of the base is formed to have a step.

6. The device of claim 5, wherein a bottom portion of the transparent member engages the step of the base.

7. The device of claim 1, wherein the transparent member is a glass window, and the difference in vertical position between the upper surfaces of the transparent member and the base is 300 μm or smaller.

8. The device of claim 1, wherein the transparent member is a glass window, and the difference in vertical position between the upper surfaces of the transparent member and the base is 100 μm or smaller.

9. The device of claim 1, wherein the transparent member is a hologram.

10. The device of claim 1, wherein the side face of the opening of the base engages only a part of the side surface of the transparent member.

11. The device of claim 1, wherein a portion of the transparent member extends laterally over the front side face of the base.

12. The device of claim 11, wherein the portion of the transparent member engages the front side face of the base.

13. The device of claim 1, wherein an upper potion of the transparent member has a flange disposed on the front side face of the base.

14. The device of claim 1, further comprising:
    a solder ball coupled to the external terminal portion of the wire,
    wherein the external terminal portion is located in a position higher than a back surface of the light emitting/receiving element, and
    a top of the solder ball is located in the same position as the back face of the light emitting/receiving element, or in a position lower than the back face of the light emitting/receiving element.

15. The device of claim 1,
wherein the side face of the opening has one straight taper, and
the transparent member is held on the middle of the taper of the opening.

16. The device of claim 1,
wherein the internal terminal portion, the external terminal portion and the back side face of the base are flush.

17. The device of claim 1, further comprising:
a sealing resin provided around the light emitting/receiving element.

18. The device of claim 1,
wherein a back surface of the light emitting/receiving element is exposed.

19. An optical device comprising:
a base provided with a through hole whose side face has a taper widened upward;
a wire buried in the base so that an internal terminal portion and an external terminal portion are exposed from the lower surface of the base;
a light emitting/receiving element electrically connected to the internal terminal portion of the wire with a bump; and
a transparent member whose side surface has a taper widened upward so that at least part of the side surface of the member engages the side face of the base.

20. The device of claim 19,
wherein the side face of the through hole has one straight taper, and
the transparent member is held on the middle of the taper of the through hole.

* * * * *